United States Patent [19]

Kronenberg et al.

[11] Patent Number: 5,287,050
[45] Date of Patent: Feb. 15, 1994

[54] METHOD OF SYNCHRONIZATION FOR AN INDICATING INSTRUMENT WITH ELECTROMAGNETICALLY CONTROLLED STEPPING MOTOR

[75] Inventors: Klaus Kronenberg, Schwalbach/TS; Matthias Giron, Frankfurt am Main; Robert Belz, Wiesbaden; Wolfgang Obst, Schmitten, all of Fed. Rep. of Germany

[73] Assignee: VDO Adolf Schindling AG, Frankfurt am Main, Fed. Rep. of Germany

[21] Appl. No.: 959,736

[22] Filed: Oct. 13, 1992

[30] Foreign Application Priority Data

Jan. 11, 1992 [DE] Fed. Rep. of Germany ....... 4200551

[51] Int. Cl.$^5$ .............................................. H02P 8/00
[52] U.S. Cl. ..................................... 318/696; 318/685
[58] Field of Search ................................ 318/696, 685

[56] References Cited

U.S. PATENT DOCUMENTS

| | | | |
|---|---|---|---|
| 4,912,692 | 3/1990 | Kamens | 318/696 |
| 5,032,781 | 7/1991 | Kronenberg | 318/696 |
| 5,103,151 | 4/1992 | Kondo et al. | 318/696 |
| 5,151,640 | 9/1992 | Sakamoto et al. | 318/696 |
| 5,185,627 | 2/1993 | Hartman | 318/696 |

Primary Examiner—Wiliam M. Shoop, Jr.
Assistant Examiner—Karen Masih
Attorney, Agent, or Firm—Martin A. Farber

[57] ABSTRACT

A method is provided for synchronizing the counter of an electronic control device with the zero position, defined by a mechanical stop, of a pointer in an indicating instrument. The pointer is driven via a step-down gearing by a stepping motor having two windings perpendicular to each other and a two-pole rotor. The two windings are connected alternately to a source of voltage and to a measuring mechanism for determining the voltage induced in a winding not traversed by current. The pointer moves stepwise up to the mechanical stop, and the counter is set to zero in the absence of an induction. The method is substantially less expensive than prior methods. Upon an assembling of the stepping motor and the indicating instrument, a given alignment of the two-pole motor is associated with the zero position of the pointer, and the rotor is brought into this given alignment each time upon the start of the method. Thereupon the determination of the induction is effected each time only in the position of the rotor which follows this given alignment by one step.

8 Claims, 1 Drawing Sheet

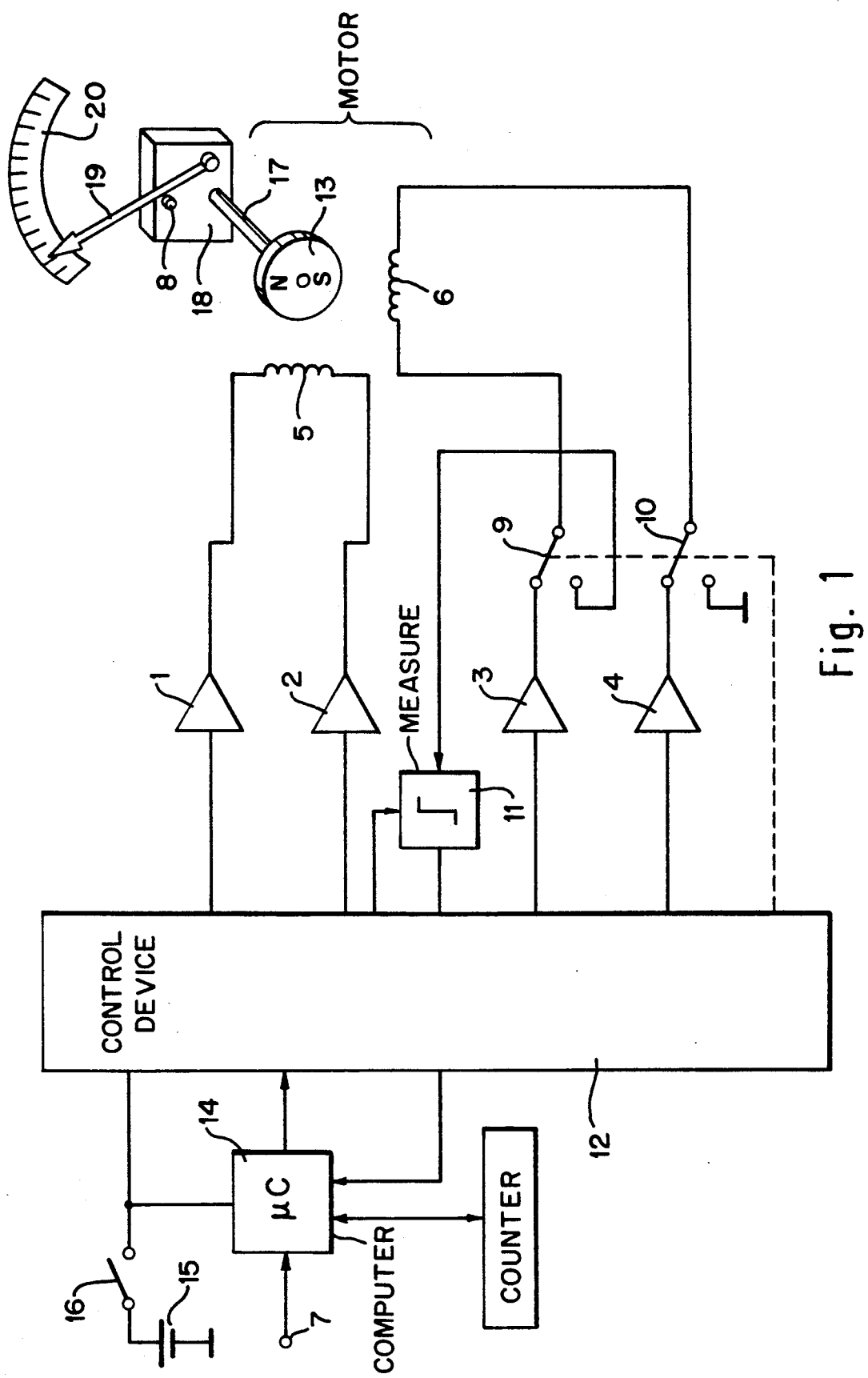

METHOD OF SYNCHRONIZATION FOR AN INDICATING INSTRUMENT WITH ELECTROMAGNETICALLY CONTROLLED STEPPING MOTOR

FIELD AND BACKGROUND OF THE INVENTION

The present invention refers to a method for synchronizing the counter of an electric control device with the zero position, defined by a mechanical stop, of a pointer of an indicating instrument which is driven via a step-down gearing by a stepping motor having two windings perpendicular to each other and a two-pole rotor. The two windings are connected alternately to a source of voltage and to a measuring mechanism for determining the voltage induced in the winding not traversed by a current, the pointer being moved step-wise up to the mechanical stop and the counter being set to zero in the absence of an induction.

Such a method is described in German OS 39 21 462. As a result of the interpositioning of the gearing, no dependable conclusions can be derived from the position of the rotor in the stepping motor as to the position of the pointer in the indicating instrument. That position is represented only by the counter of the electronic control device, the reading of which, however, may be disturbed for various reasons. In order that no erroneous indications can result therefrom the counter must be constantly resynchronized with the position of the pointer, for which purpose, in the known method the zero position of the pointer defined by a mechanical stop is used in combination with a test program in which the stepping motor is controlled for movement of the pointer in the direction of the zero position until the end of movement of the pointer is detected by the absence of an induced voltage in the winding of the stepping motor which is not traversed at the time by current for the driving of the pointer. The counter can then be set to zero or to the value corresponding to the zero position of the pointer.

In accordance with this prior method, the windings of the stepping motor are alternately acted on by the full drive voltage and connected to a measuring mechanism. With two windings arranged at right angles to each other, there are obtained hereby 90° steps of the two-pole rotor. Since the test method is based on the evaluation of the induced voltage, the individual rotor steps must have a given minimum size in order for the induced voltage to be sufficiently large to be able to distinguish reliably from an absence of the induction.

The known method operates satisfactorily, but it is still considered capable of improvement. For each revolution of the rotor, four switching and four test routines are present in the case of 90° steps, which is too complicated from a circuit standpoint.

SUMMARY OF THE INVENTION

It is an object of the invention so further to develop the aforementioned method that the desired synchronization can be obtained at definitely less expense.

According to the invention, upon the assembling of stepping motor and indicating device, a given alignment of the two-pole motor is so associated with the zero position of the pointer that the rotor is brought into this given alignment each time upon the start of the method. A determination of the induction is effected each time only in the position of the rotor which follows this given alignment by one step.

By the associating of a given alignment of the rotor with the zero position of the pointer there is obtained a sort of presynchronization by which assurance is had that the zero position of the pointer can be reached positively only upon a given step of the rotor, and that therefore in the case of 90° steps, only one of four steps must be checked. The circuit expense is reduced to 50% of that of the known method since only one of the two windings need now be connected alternately to the source of voltage and the measuring mechanism.

Further, according to the invention, the method is started in the manner that the windings of the stepping motor are traversed by current in accordance with the selected electric position of the rotor.

Another feature of the invention is that the method is carried out upon each placing in operation and placing out of operation of the indicating device.

Yet further according to the invention, it is carried out whenever the input signal for the indicating device corresponds to the zero position of the pointer.

Also the invention provides that the electronic control device starts, monitors and terminates the method.

Still further, the invention provides the application of the method on indicating instruments which are driven by stepping motors which have more than two windings and/or a rotor having more than two poles. This is accomplished by switching selectively sets of windings for alternate energization and connection to a current measurement circuit.

BRIEF DESCRIPTION OF THE DRAWING

With the above and other advantages in view, the present invention will become more clearly understood in connection with the detailed description of a preferred embodiment, when considered with the accompanying drawing, of which:

FIGURE 1 is a circuit diagram, partly in perspective view, illustrating the invention.

DETAILED DESCRIPTION OF THE PREFERRED EMBODIMENT

For the control of the two windings 5, 6 of the stepping motor, four driver stages 1, 2, 3, 4 are provided. The two-pole rotor 13 of the stepping motor is driven in known manner by alternating magnetic fields in the windings 5, 6. By means of a shaft 17 and a gearing 18, the pointer 19 is moved over a scale 20 of the indicating instrument. When the pointer 18 rests against a stop 8, its tip points to the beginning of the scale, i.e., to the zero position of the measurement range. The driver stages 1, 2, 3, 4 are controlled by an electronic control device 12 which, as well as a microcomputer 14, are connected via a switch 16 to a source of voltage 15. 7 is the input for the measurement signal.

Switches 9 and 10 are provided between the driver stages 3 and 4 and the winding 6, by means of which switches the winding 6 can be connected either to the driver stages 3 and 4 or to a measuring mechanism 11. In accordance with the invention, the switching to the measuring mechanism 11 takes place during the synchronization method in each case only in the position following by one step a given alignment of the rotor. This position is fixed upon an assembling of stepping motor and indicating instrument by association with the zero position of the pointer 19.

We claim:

1. A method for synchronizing the counter of an electric control device with the zero position of a pointer of an indicating instrument the zero position being defined by a mechanical stop of the indicating instrument, the pointer being driven via a stepdown gearing by a stepping motor having two windings perpendicular to each other and a two-pole rotor, the method comprising:

connecting alternately the two windings to the source of voltage and to a measuring mechanism for determining a voltage induced in the winding not traversed by a current, the pointer being moved step-wise up to the mechanical stop and the counter being set to zero in the absence of an induction;

upon the assembling of the stepping motor and the indicating device, associating a given alignment of the two-pole motor with the zero position of the pointer;

bringing the rotor into the given alignment each time upon the start of the method;

rotating the rotor to a position for measurement of a voltage induced in the winding not traversed by a current, wherein the rotor position follows the given alignment by one step of the stepping motor; and setting the counter to zero.

2. A method according to claim 1, further comprising an earlier step of applying current to the windings of the stepping motor in accordance with a selected electric position of the rotor.

3. A method according to claim 2, wherein the method is carried out upon each activation and deactivation of the indicating device.

4. A method according to claim 1, wherein the method is carried out upon each activation and deactivation of the indicating device.

5. A method according to claim 1, wherein the method is carried out whenever the input signal for the indicating device corresponds to the zero position of the pointer.

6. A method according to claim 2, wherein the method is carried out whenever the input signal for the indicating device corresponds to the zero position of the pointer.

7. A method according to claim 1, further comprising a step of employing the electronic control device to start, to monitor, and to terminate the method.

8. A method according to claim 5, further comprising a step of selecting groups of windings for the application of the method on indicating instruments which are driven by stepping motors which have more than two winding and/or a rotor having more than two poles.

* * * * *